United States Patent [19]

Shin

[11] Patent Number: 5,982,316

[45] Date of Patent: Nov. 9, 1999

[54] DELTA-SIGMA MODULATOR FOR AN ANALOGUE-TO-DIGITAL CONVERTER WITH ONLY ONE FEEDBACK COEFFICIENT

[75] Inventor: Yun Tae Shin, Kyoungki-do, Rep. of Korea

[73] Assignee: Hyundai Electronics Industries Co., Ltd., Ichon-shi, Rep. of Korea

[21] Appl. No.: 08/958,484

[22] Filed: Oct. 27, 1997

[30] Foreign Application Priority Data

Oct. 25, 1996 [KR] Rep. of Korea .................. 96-48686

[51] Int. Cl.$^6$ ........................................ H03M 3/00
[52] U.S. Cl. ........................................ 341/143; 341/155
[58] Field of Search ........................... 341/143, 118, 341/155, 144

[56] References Cited

U.S. PATENT DOCUMENTS 5,055,846  10/1991  Welland .
5,719,573  2/1998  Leung et al. ................. 341/143

*Primary Examiner*—Brian Young
*Attorney, Agent, or Firm*—Jacobson, Price, Holman & Stern, PLLC

[57] ABSTRACT

Disclosed is a delta-sigma modulator (or noise shaper) having resolution over 18 bits. The delta-sigma modulator may increase the linearity and decrease its size, by employing only one feedback loop path and applying a coefficient of less than 1 to the integrators. Also, the delta-sigma modulator according to the present invention may be used for the analogue-to-digital convertor with the reduction of the effective value of capacitor. In the case where the decimal values are corrected to digital values, it is possible to design the digital noise shaper which is used in the digital-to-analogue convertor.

18 Claims, 5 Drawing Sheets

DELTA-SIGMA MODULATOR FOR AN ANALOGUE-TO-DIGITAL CONVERTER WITH ONLY ONE FEEDBACK COEFFICIENT

BACKGROUND OF THE INVENTION

1. Field of the Invention

The present invention relates to a modulator used in an analogue-digital converter and a digital-analogue converter and, more particularly, to a delta-sigma modulator (or noise shaper) having resolution over 18 bits.

2. Description of the Related Art

In general, a delta-sigma modulator, which is used in the oversampling an analogue-to-digital converter (hereinafter, referred to as an ADC) and a digital-to-analogue converter (hereinafter, referred to as a DAC) are used as a low-pass filter with respect to input signal, and also the transition of quantized noise is achieved in a high frequency region. With the increase of the order in its architecture and the oversampling ratio, the noise may decrease in frequency band of interest. In particular, since the signal-to-noise ratio is over 100 dB, in the case of the audio signal processing, the modulator is designed at the oversampling ratio of 128 and the order of 4. However, its area may increase. Accordingly, in the case of the audio signal processing of 18-bit resolution, the modulator is typically designed at the oversampling ratio of 64 and a fifth order architecture.

FIG. 1 is a detailed block diagram illustrating a conventional delta-sigma modulator in the fifth order architecture. The conventional delta-sigma modulator, shown in FIG. 1, is described in U.S. Pat. No. 5,274,375. entitled "Delta-Sigma Modulator For an Analogue-to-Digital Converter with Low Thermal Noise Performance", assigned to Crystal Semiconductor Corporation. In FIG. 1, the reference numerals 40, 44, 46, 50 and 52 denote integrators, 54 and 56 multipliers indicating feedback coefficients, 60, 62, 64, 66 and 68 feedforward coefficient blocks, 26 and 28 comparators, 70 a three-level DAC, 38, 42, 48 and 58 summing junctions, respectively.

As shown in FIG. 1, two feedback loops (multipliers 54 and 56) are provided to secure stability of the delta-sigma modulator. In the first feedback loop, the output of the integrator 46 is fed to the summing junction 42 in the front of the integrator 44 via the multiplier 54 having the feedback coefficient of 0.0115. In the second feedback loop, the output from the integrator 52 is fed to the summing junction 48 in the front of the integrator 44 via the multiplier 56 having the feedback coefficient of 0.020. In the delta-sigma modulator including the feedback loops, the more the number of feedback loops is, the higher its stability is. The increase of the feedback loops may cause its linearity to deteriorate.

Particularly, the decrease of the linearity and the increase of its size result from the first feedback loop. Accordingly, it is desired that the coefficient within the first feedback loop is set to a low value in order that the "zero" point in the input signal band can be in close vicinity to the frequency of 0. However, in this case, the low value of coefficient causes the chip size to be increased.

SUMMARY OF THE INVENTION

It is an object of the present invention to provide a delta-sigma modulator capable of being manufactured in a small chip size with the improved linearity and signal-to-noise ratio.

In accordance with an aspect of the present invention, there is provided a delta-sigma modulator, for used in an analog-digital converter, employing a fifth order architecture, which comprising: a loop filter for receiving an input signal and for processing the difference between the input signal and a feedback digital-to-analog converter (DAC) signal to provide a filtered signal, which include: five integration stages connected in a cascaded configuration, a second integration stage including a gain coefficient smaller than a unit; and at least one feedback path for providing only an output of a fifth integration stage to one of inputs of a second, a third and a fourth integration stages, wherein the feedback path has only one feedback coefficient; a multi-level quantizer for receiving an output of the loop filter to generate M-level quantizer value, M being a positive integer; and an M-level digital-to-analog converter for receiving the output from the loop filter to generate the feedback DAC signal In accordance with another aspect of the present invention, there is provided a loop filter for receiving an input signal and for processing the difference between the input signal and a feedback digital-to-analog converter (DAC) signal to provide a filtered signal, which include: five integration stages, connected in a cascaded configuration, second integration stage thereof including a gain coefficient smaller than a unit; at least one feedback path for providing only an output of a fifth integration stage to one of inputs of a second, a third and a fourth integration stages, wherein the feedback path has only ones feedback coefficient; five forward paths, each connected to an output of corresponding each integration stage and having a corresponding forward coefficient; and a summing circuit for receiving an output from said each forward path to generate the filtered signal by summing the outputs from the five forward paths.

BRIEF DESCRIPTION OF THE DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF THE PREFERRED EMBODIMENTS

Hereinafter, the present invention will be described in detail referring to accompany drawings.

Figure 1:
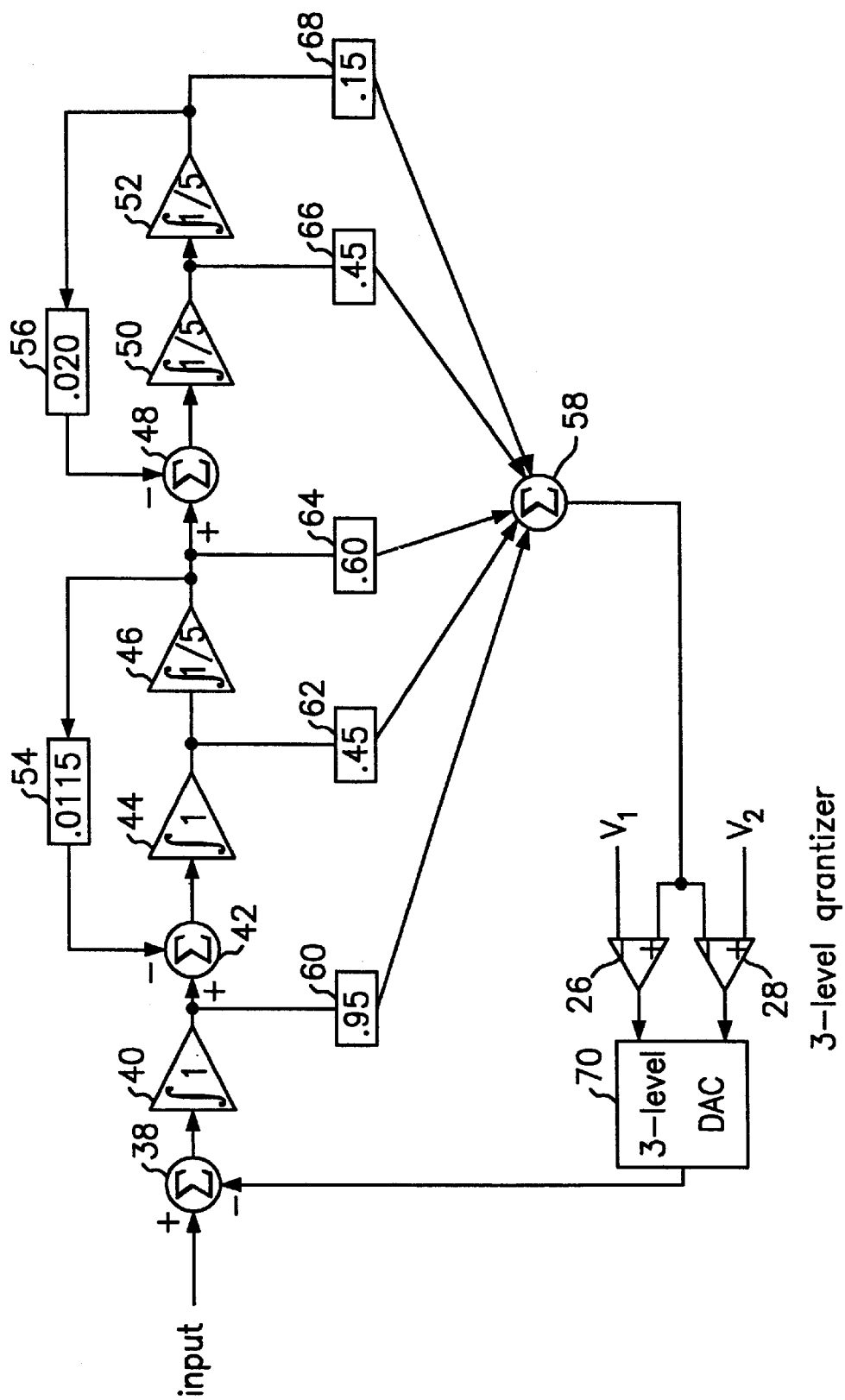
FIG. 1 is a detailed block diagram illustrating a conventional delta-sigma modulator in a fifth order architecture.
Figure 2:
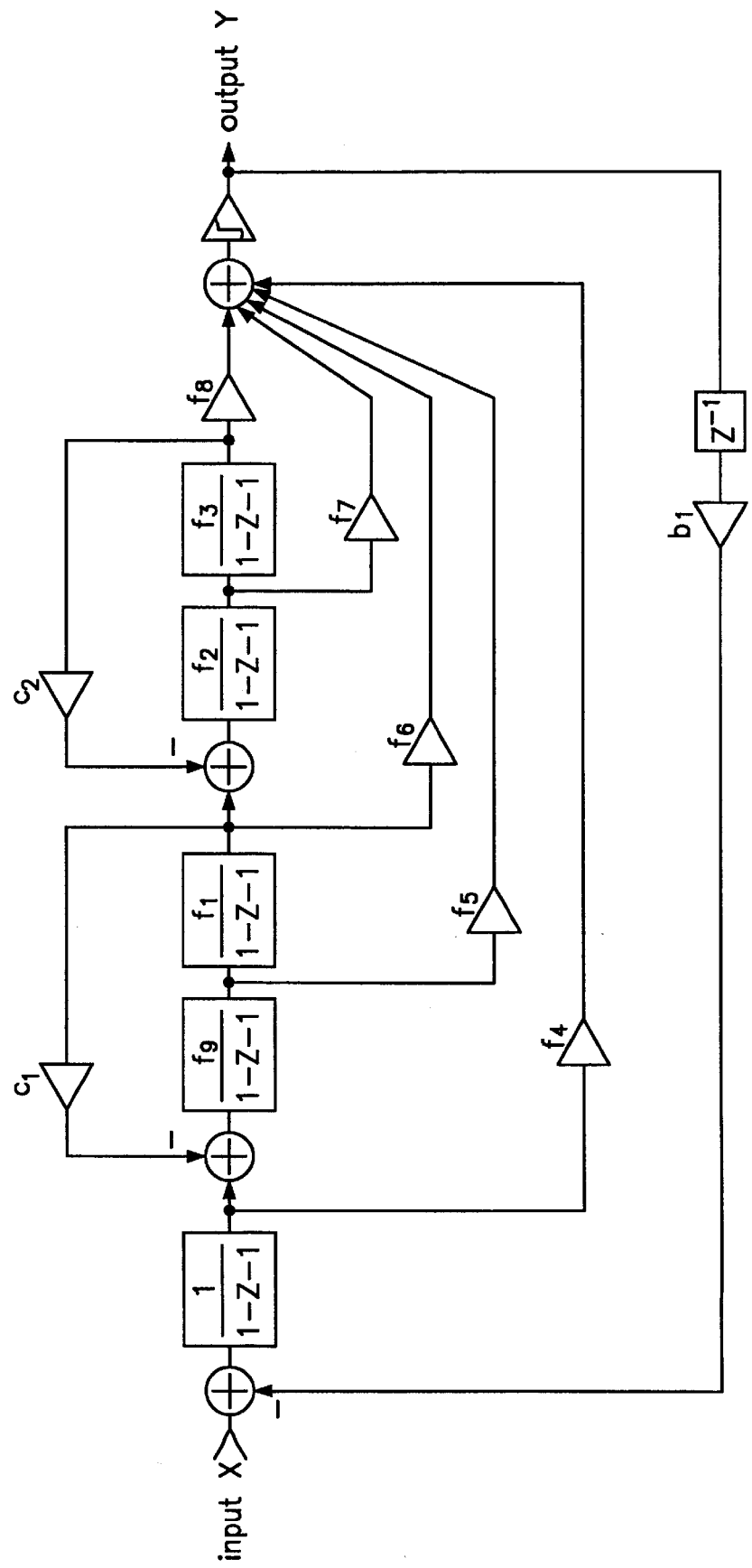
FIG. 2 is a block diagram illustrating transfer functions in the conventional delta-sigma modulator of FIG. 1.

First, referring now to FIG. 2 illustrating transfer functions in the conventional delta-sigma modulator of FIG. 1, the output signal Y in Z-region is given by:

$$Y = \frac{(-a_5 z^{-5} + a_4 z^{-4} - a_3 z^{-3} + a_2 z^{-2} - a_1 z^{-1} + a_0)X}{k_6 z^{-6} - k_5 z^{-5} + k_4 z^{-4} - k_3 z^{-3} + k_2 z^{-2} - k_1 z^{-1} + k_0} + \quad (1)$$

-continued $$\frac{(z^{-6} - d_5 z^{-5} + d_4 z^{-4} - d_3 z^{-3} + d_2 z^{-2} - d_1 z^{-1} + d_0)q}{k_6 z^{-6} - k_5 z^{-5} + k_4 z^{-4} - k_3 z^{-3} + k_2 z^{-2} - k_1 z^{-1} + k_0}$$

where X is an input signal and q is a quantization noise signal.

$$a_5 = f_4 \qquad (2)$$

$$a_4 = 5f_4 + f_5 f_9$$

$$a_3 = 10 f_4 + f_4(f_1 f_9 c_1 + f_2 f_3 c_2) + 4 f_5 f_9 + f_1 f_6 f_9$$

$$a_2 = 10 f_4 + 3 f_4(f_1 f_9 c_1 + f_2 f_3 c_2) + 6 f_5 f_9 + f_2 f_3 f_5 f_9 c_2 + 3 f_1 f_6 f_9 + f_1 f_2 f_7 f_9$$

$$a_1 = 5 f_4 + 3 f_4(f_1 f_9 c_1 + f_2 f_3 c_2) + f_1 f_2 f_3 f_4 f_9 c_1 c_2 + 4 f_5 f_9 + 2 f_2 f_3 f_5 f_9 c_2 + 3 f_1 f_6 f_9 + f_1 f_2 f_3 f_6 f_9 c_2 + 2 f_1 f_2 f_7 f_9 + f_1 f_2 f_3 f_8 f_9$$

$$a_0 = f_4 + f_4(f_1 f_9 c_1 + f_2 f_3 c_2) + f_1 f_2 f_3 f_4 f_9 c_1 c_2 + f_5 f_9 + f_2 f_3 f_5 f_9 c_2 + f_1 f_6 f_9 + f_1 f_2 f_3 f_6 f_9 c_2$$

$$d_5 = 6$$

$$d_4 = 15 + f_1 f_9 c_1 + f_2 f_3 c_2$$

$$d_3 = 20 + 4(f_1 f_9 c_1 + f_2 f_3 c_2)$$

$$d_2 = 15 + 6(f_1 f_9 c_1 + f_2 f_3 c_2) + f_1 f_2 f_3 f_9 c_1 c_2$$

$$d_1 = 6 + 4(f_1 f_9 c_1 + f_2 f_3 c_2) + 2 f_1 f_2 f_3 f_9 c_1 c_2$$

$$d_0 = 1 + f_1 f_9 c_1 + f_2 f_3 c_2 + f_1 f_2 f_3 f_9 c_1 c_2$$

$$k_6 = 1 - f_4 b_1$$

$$k_5 = 6 - 5 f_4 b_1 - f_5 f_9 b_1$$

$$k_4 = 15 + f_1 f_9 c_1 + f_2 f_3 c_2 - 10 f_4 b_1 - f_4 b_1(f_1 f_9 c_1 + f_2 f_3 c_2) - 4 f_5 f_9 b_1 - f_1 f_6 f_9 b_1$$

$$k_3 = 20 + 4(f_1 f_9 c_1 + f_2 f_3 c_2) - 10 f_4 b_1 - 3 f_4 b_1(f_1 f_9 c_1 + f_2 f_3 c_2) - 6 f_5 f_9 b_1 - f_2 f_3 f_5 f_9 b_1 c_2 - 3 f_1 f_6 f_9 b_1 - f_1 f_2 f_7 f_9 b_1$$

$$k_2 = 15 + 6(f_1 f_9 c_1 + f_2 f_3 c_2) + f_1 f_2 f_3 f_9 c_1 c_2 - 5 f_4 b_1 - 3 f_4 b_1(f_1 f_9 c_1 + f_2 f_3 c_2) - f_1 f_2 f_3 f_4 f_9 b_1 c_1 c_2 - 4 f_5 f_9 b_1 - 2 f_2 f_3 f_5 f_9 b_1 c_2 - 3 f_1 f_6 f_9 b_1 - f_1 f_2 f_3 f_6 f_9 b_1 c_2 - 2 f_1 f_2 f_7 f_9 b_1 - f_1 f_2 f_3 f_8 f_9 b_1$$

$$k_1 = 6 + 4(f_1 f_9 c_1 + f_2 f_3 c_2) + 2 f_1 f_2 f_3 f_9 c_1 c_2 - f_4 b_1 - f_4 b_1(f_1 f_9 c_1 + f_2 f_3 c_2) - f_1 f_2 f_3 f_4 f_9 b_1 c_1 c_2 - f_5 f_9 b_1 - f_2 f_3 f_5 f_9 b_1 c_2 - f_1 f_6 f_9 b_1 - f_1 f_2 f_3 f_6 f_9 b_1 c_2 - f_1 f_2 f_7 f_9 b_1 - f_1 f_2 f_3 f_8 f_9 b_1$$

$$k_0 = 1 + f_1 f_9 c_1 + f_2 f_3 c_2 + f_1 f_2 f_3 f_9 c_1 c_2$$

where $f_1$, $f_2$, $f_3$, and $f_9$ respectively denote coefficients of integrators 46, 50, 52 and 44 in FIG. 1; $f_4$, $f_5$, $f_6$, $f_7$, and $f_8$ respectively denote the values of forward coefficient blocks 60, 62, 64, 66 and 68 in FIG. 1; $c_1$ and $c_2$ denote feedback coefficients in the first and second feedback loops 54 and 56 in FIG. 1, respectively; and $b_1$ denotes a coefficient of the three-level DAC 70 to delay the output (Y) by $z^{-1}$ in FIG. 1.

In equations (1) and (2), in the case of $b_1=1$ and $c_1=0$. because the values of $f_1$, $f_2$, $f_3$, $f_9$, $f_4$, $f_5$, $f_6$, $f_7$, $f_8$, $c_1$, $c_2$, and $b_1$ are positive, the "zero" point in the input signal band can be in close vicinity to the frequency of 0. Furthermore, if the delta-sigma modulator applies a coefficient of less than 1 to the integrator in the first feedback loop without using the first feedback loop ($C_1=0$), the area of the chip may be increased.

The present invention provides a new delta-sigma modulator to satisfy the above-stated conditions.

Figure 3:
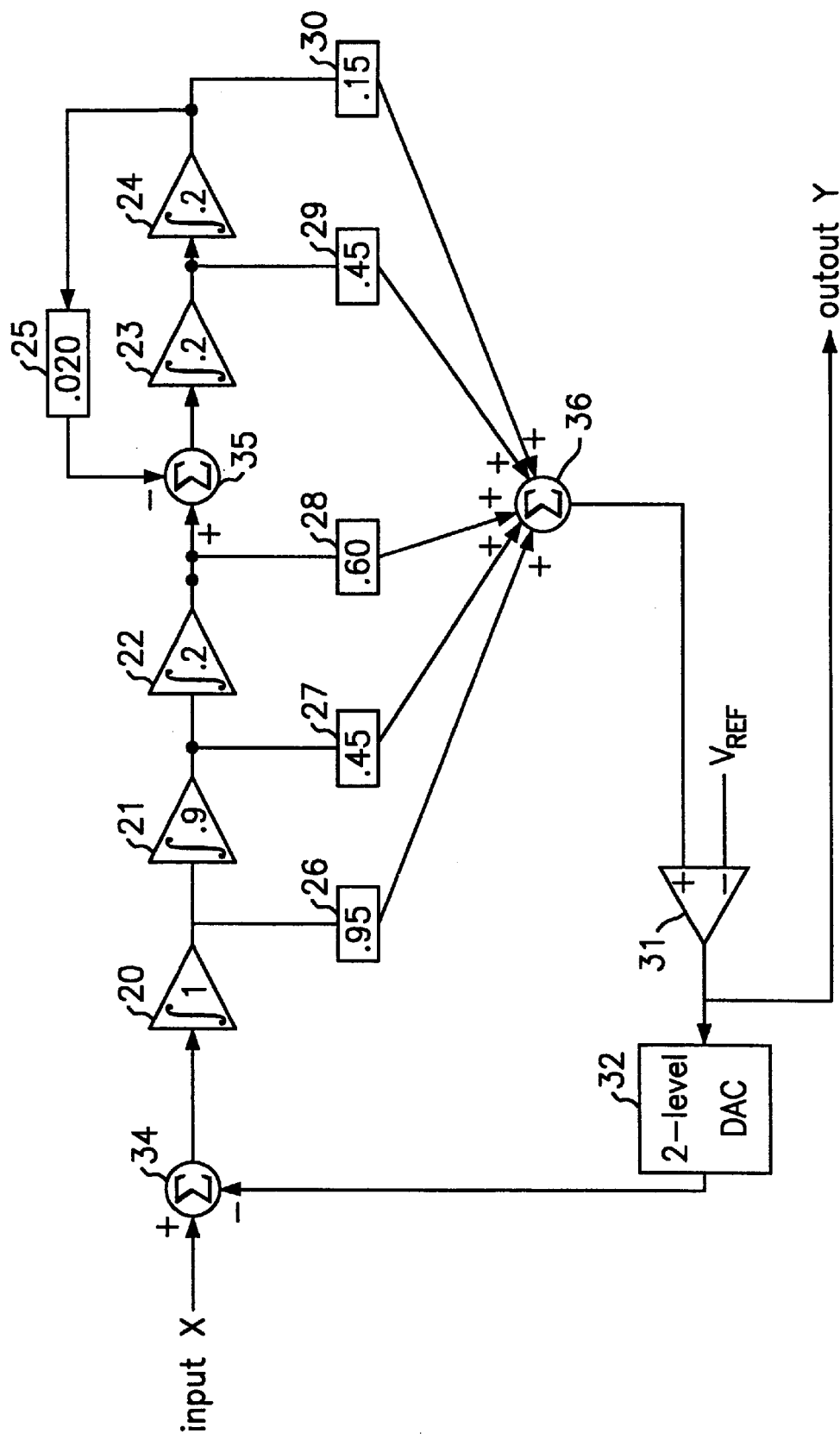
FIG. 3 is a detailed block diagram illustrating a delta-sigma modulator in a fifth order architecture according to the present invention.

Referring now to FIG. 3. there is illustrated a more detailed block diagram of the delta-sigma modulator according to the present invention. An input signal is provided that is fed to the positive input of a summing junction 34. the output of which is input to an integrator 20 in a first stage having a gain coefficient of 1. The output of integrator 20 is input to an integration 21 in a second stage having a gain coefficient of 0.9. The output of integrator 21 is connected to the input of an integrator 22 having a gain coefficient of 0.2. The output of the integration 22 in a third stage is input to the positive input of a summing junction 35. The output of the summing junction 35 is input to the input of an integrator 23 in a fourth stage having a gain coefficient of 0.2. The output of the integrator 23 is input to the input of an integrator 24 in a fifth stage having a gain coefficient of 0.2.

A feedback path is provided between the output of the fifth stage of the integrator 24 and the negative input of the summing junction 35. This feedback path has a feedback coefficient of 0.02 as indicated by a feedback coefficient block 25. Feedforward coefficients are also provided between the output of each of the integrators 20, 21, 22, 23 and 24 and a summing junction 36. The feedforward path between the output of the integrator 20 in the first integration stage and the summing junction 36 has a feedforward coefficient of 0.95, as indicated by a feedforward coefficient box 26.

Also, the feedforward path between the output of the integrator 21 in the second integration stage and the summing junction 36 has a feedforward coefficient of 0.45, as indicated by a feedforward coefficient box 27. The output of the feedforward coefficient between the output of the integrator 22 in the third stage of integration and the summing junction 36 has a feedforward coefficient of 0.60, as indicated by a feedforward coefficient box 28. The feedforward path between the output of the integrator 23 in the fourth stage of integration and the summing junction 36 has a feedforward coefficient of 0.45, as indicated by a feedforward coefficient box 29. The output of the feedforward path between the output of the integrator 24 in the fifth stage of integration and the summing junction 36 has a feedforward coefficient of 0.2, as indicated by a feedforward coefficient box 30.

The output of the summing junction 36 is input to the two-level quantizer which includes a comparator 31, the outputs of which are connected to a two-level DAC 32. The output of the two-level DAC 32 is input to the negative input of the summing junction 34.

Figure 4:
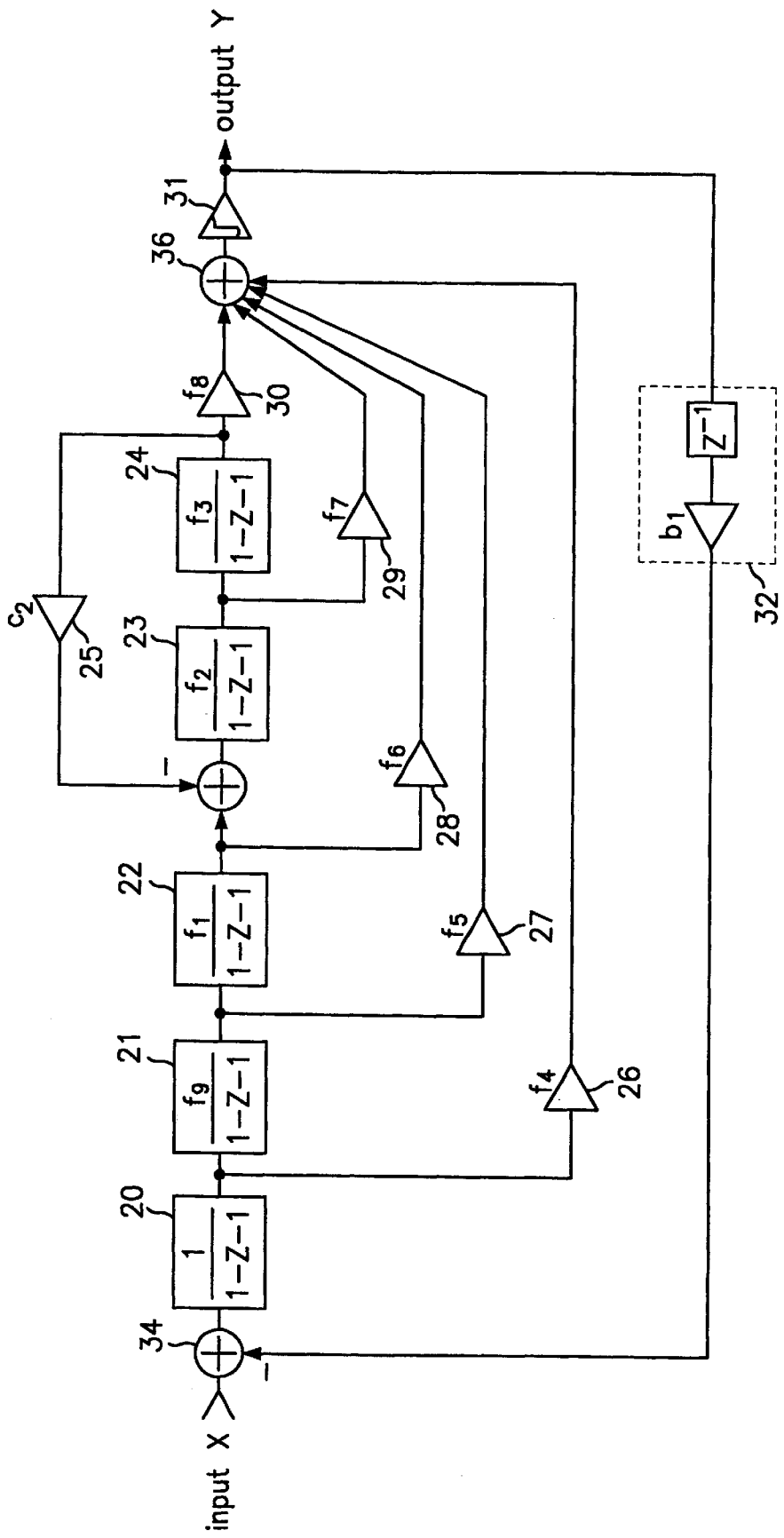
FIG. 4 is a block diagram illustrating transfer functions in the delta-sigma modulator of FIG. 3.

FIG. 4 is a block diagram illustrating transfer functions in the delta-sigma modulator of FIG. 3. In similar to FIG. 3, in FIG. 4, $f_1$, $f_2$, $f_3$, and $f_9$ respectively denote coefficients of integrators 22, 23, 24 and 21 in FIG. 3; $f_4$, $f_5$, $f_6$, $f_7$, and $f_8$ respectively denote values of forward coefficient blocks 26 to 30 in FIG. 3; $c_2$ denotes feedback coefficients in the feedback loops in FIG. 3; and $b_1$ denotes a coefficient of the two-level DAC 32 to delay the output (Y) by $z^{-1}$ in FIG. 3.

Although, in the above-mentioned embodiment, the output of the integrator 24 is fed to the input of the integrator 23, it is possible to modify the feedback loop path. That is, the output of the integrator 24 can be fed to the input of the integrator 21 or integrator 22. Furthermore, the output of the integrator 24 can be simultaneously fed to inputs of the integrators 21, 22 and 23. As a result, at least one feedback loop path may be formed between the final integrator 24 and the input of other integrators via only one feedback coefficient.

Figure 5:
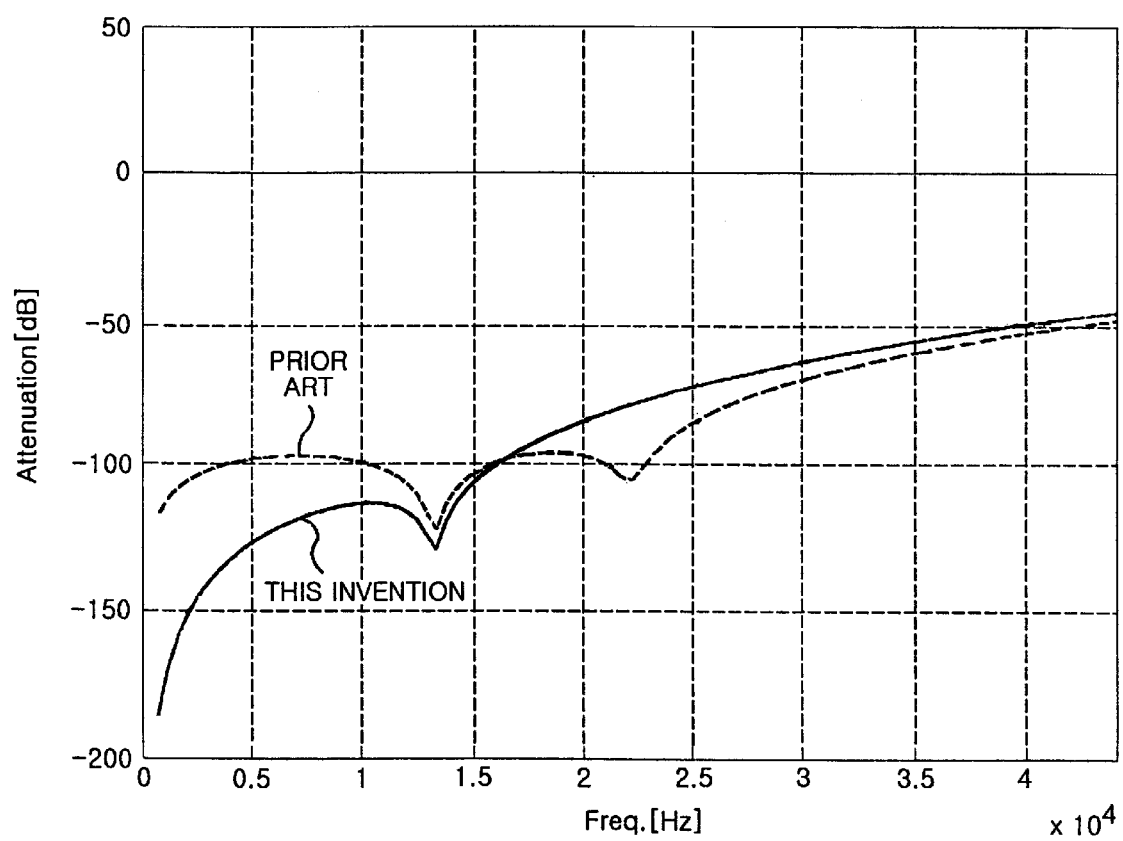
FIG. 5 is a plot illustrating the attenuation of input signal according to the present invention in comparison with that of prior art.

Referring to FIG. 5, there is shown a plot illustrating the attenuation of input signal according to the present invention in comparison with that of prior art. As can seen on the above, it should be readily appreciated that, while the prior art results in two ripples, the delta-sigma modulator according to the present invention shows only one ripple.

As apparent from the above description, the delta-sigma modulator according to the present invention may increase the linearity and decrease its size, by employing only one feedback loop path and applying a coefficient of less than 1 to the second integrator. Also, the delta-sigma modulator according to the present invention may be used for the analogue-to-digital convertor with the reduction of the effective value of capacitor. In the case where the decimal values are corrected to digital values, it is possible to design the digital noise shaper which is used in the digital-to-analogue convertor.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A delta-sigma modulator, for use in an analog-digital converter, employing a fifth order architecture, comprising:
    a loop filter for receiving an input signal and for processing the difference between the input signal and a feedback digital-to-analog converter (DAC) signal to provide a filtered signal, the loop filter including:
        five integration stages connected in a cascaded configuration, a second integration stage including a gain coefficient smaller than a unit; and
        at least one feedback path for providing only an output of a fifth integration stage to one of inputs of a second, a third and a fourth integration stages, wherein the feedback path has only one feedback coefficient;
    a multi-level quantizer for receiving an output of the loop filter to generate M-level quantizer value, M being a positive integer; and
    an M-level digital-to-analog converter for receiving the output from the loop filter to generate the feedback DAC signal.

2. The delta-sigma modulator as recited in claim 1, wherein the feedback path includes a feedback path for providing said output of the fifth integration stage to an input of a fourth integration stage.

3. The delta-sigma modulator as recited in claim 2, wherein the feedback path further includes;
    a feedback path for providing said output of the fifth integration stage to an input of a third integration stage; and
    a feedback path stage for providing said output of the fifth integration stage to an input of a second integration stage, wherein the feedback paths has a same feedback coefficient.

4. The delta-sigma modulator as recited in claim 3, wherein the feedback coefficient is of 0.02.

5. The delta-sigma modulator as recited in claim 4, wherein a gain coefficient of a first feedback coefficient is of 1 and a gain coefficient of the second feedback coefficient is in range from 0.9 to 0.8.

6. The delta-sigma modulator as recited in claim 5, wherein the loop filter further includes five forward paths, each connected to an output of corresponding each integration stage and having a corresponding forward coefficient.

7. The delta-sigma modulator as recited in claim 6, wherein the loop filter further includes a summing circuit for receiving an output from said each forward path to generate the filtered signal by summing the outputs from the five forward paths.

8. In a delta-sigma modulator for an analog-digital converter, a loop filter for receiving an input signal and for processing the difference between the input signal and a feedback digital-to-analog converter (DAC) signal to provide a filtered signal, the loop filter including:
    five integration stages, connected in a cascaded configuration, second integration stage thereof including a gain coefficient smaller than a unit;
    at least one feedback path for providing only an output of a fifth integration stage to one of inputs of a second, a third and a fourth integration stages, wherein the feedback path has only one feedback coefficient;
    five forward paths, each connected to an output of corresponding each integration stage and having a corresponding forward coefficient; and
    a summing circuit for receiving an output from said each forward path to generate the filtered signal by summing the outputs from the five forward paths.

9. The loop filter as recited in claim 8, wherein the feedback path includes a feedback path for providing said output of the fifth integration stage to an input of a fourth integration stage.

10. The loop filter as recited in claim 9, wherein the feedback path further includes;
    a feedback path for providing said output of the fifth integration stage to an input of a third integration stage; and
    a feedback path stage for providing said output of the fifth integration stage to an input of a second integration stage, wherein the feedback paths has a same feedback coefficient.

11. The loop filter as recited in claim 10, wherein the feedback coefficient is of 0.02.

12. The loop filter as recited in claim 10, wherein a gain coefficient of a first feedback coefficient is of 1 and a gain coefficient of the second feedback coefficient is in range from 0.9 to 0.8.

13. A delta-sigma modulator, for use in an analog-digital converter, employing a fifth order architecture, comprising:
    a loop filter for receiving an input signal and for processing the difference between the input signal and a feedback digital-to-analog converter (DAC) signal to provide a filtered signal, the loop filter including:
        five integration stages, connected in a cascaded configuration, a second integration stage thereof including a gain coefficient smaller than a unit;
        a feedback path for providing only an output of a fifth integration stage to an input of a fourth integration stage, wherein the feedback path has a feedback coefficient;
        five forward paths, each connected to an output of corresponding each integration stage and having a corresponding forward coefficient; and
        a summing circuit for receiving an output from said each forward path to generate the filtered signal by summing the outputs from the five forward paths;

a multi-level quantizer for receiving an output of the loop filter to generate M-level quantizer value, M being a positive integer; and an M-level digital-to-analog converter for receiving the output from the loop filter to generate the feedback DAC signal.

14. The delta-sigma modulator as recited in claim 13, wherein the feedback path further includes;

a feedback path for providing said output of the fifth integration stage to an input of a third integration stage; and a feedback path stage for providing said output of the fifth integration stage to an input of a second integration stage, wherein the feedback paths has a same feedback coefficient.

15. The delta-sigma modulator as recited in claim 14, wherein, the feedback coefficient is of 0.02.

16. The delta-sigma modulator as recited in claim 15, wherein a gain coefficient of a first feedback coefficient is of 1 and a gain coefficient of the second feedback coefficient is in range from 0.9 to 0.8.

17. The delta-sigma modulator as recited in claim 16, wherein the forward coefficients are smaller than a unit.

18. The delta-sigma modulator as recited in claim 17, wherein M is of 2.

* * * * *